United States Patent [19]

Saeki

[11] Patent Number: 5,067,911
[45] Date of Patent: Nov. 26, 1991

[54] IC HOLDER

[75] Inventor: Toshiro Saeki, Tokyo, Japan

[73] Assignee: Seikosha Co., Ltd., Tokyo, Japan

[21] Appl. No.: 600,338

[22] Filed: Oct. 19, 1990

[30] Foreign Application Priority Data

Oct. 19, 1989 [JP] Japan .................. 1-272121

[51] Int. Cl.⁵ .................. H01R 23/72; B65D 73/02
[52] U.S. Cl. .................. 439/526; 206/328
[58] Field of Search .................. 439/68, 69, 70, 71, 439/72, 73, 525, 526; 206/328-334

[56] References Cited

U.S. PATENT DOCUMENTS

| | | | |
|---|---|---|---|
| 3,825,876 | 7/1974 | Damon et al. | 206/328 |
| 4,417,777 | 11/1983 | Bamford | 439/70 |
| 4,460,236 | 7/1984 | Strautz | 439/70 |
| 4,681,221 | 7/1987 | Chickanosky et al. | 206/328 |
| 4,918,513 | 4/1990 | Kurose et al. | 357/79 |

FOREIGN PATENT DOCUMENTS 57-202073 12/1982 Japan .

Primary Examiner—Neil Abrams
Attorney, Agent, or Firm—Jordan and Hamburg

[57] ABSTRACT

An IC holder comprises an upper frame portion having a plurality of guide grooves formed in opposing inner surface portions thereof for frictionally holding a plurality of terminal pins of an IC element, a lower frame portion formed integrally on the lower side of the upper frame portion which can be fitted to the periphery of an IC socket to which the IC element is attached, and a lateral plate portion formed integrally with either the upper frame portion or the lower frame portion which faces the bottom surface of a package of the IC element to restrict the depth of fitting of the IC element. The upper frame portion has a protrusion, ridge, or recess for indicating the direction of fitting of the IC element in relation to the upper frame portion. The bottom surface of the lateral plate portion has protrusions which cooperate with bridges of the IC socket to restrict the direction of fitting of the lower frame portion in relation to the IC socket.

11 Claims, 3 Drawing Sheets

IC HOLDER

BACKGROUND OF THE INVENTION

1. Field of the Invention

This invention relates to an IC holder used in detachably attaching an integrated circuit (IC) element to an IC socket connected with a circuit board.

2. Description of the Prior Art

Conventionally, to modify the operation mode or function of a computer device as needs demand, a desired one is chosen out of a plurality of IC elements prepared for attainment of different operation modes or functions and then attached to an IC socket fixedly provided in the device. For example, an optional IC element is supplied, (1) after being mounted on a small substrate provided with a connector or (2) in the form of a single IC element, to a user so that one can incorporate it in the device. On the other hand, Japanese Patent Laid-Open No. 57-202073 discloses (3) the use of an IC socket of specific shape in which an IC element is supported on a carrier of specific shape, and a handle provided on the carrier is controlled such that the IC element is fitted in a hollow portion of the IC socket.

However, according to the first provision, such parts as small substrates, connectors for the device and the optional element, and casings are required in addition to IC elements; thus, costs increase. According to the second provision, it is difficult to connect an IC element to an IC socket, terminal pins of the IC element are liable to be bent, the IC element is liable to be misaligned and incorrectly connected with the IC socket, or other troubles occur inevitably. According to the third provision, since all parts, such as IC sockets and carriers, are not of the general purpose type, they are inconvenient to users because of high costs.

SUMMARY OF THE INVENTION

It is an object of the present invention to provide an IC holder which can use IC elements and IC sockets of the general purpose type without increasing costs, prevent the occurrence of troubles, such as bending and erroneous insertion of terminal pins of IC elements, and allow users to change IC elements without difficulty as needs demand.

It is another object of the present invention to provide an IC holder which can accept insertion of an IC element without difficulty, prevent the IC element thus held from being damaged, and allow the IC element held thereby to be detachably attached to an IC socket without difficulty.

It is still another object of the present invention to provide an IC holder which can hold an IC element with correct orientation, be fitted to an IC socket with correct orientation, and prevent the IC element from being attached to the IC socket with erroneous orientation.

To accomplish the foregoing objects, an IC holder according to the present invention comprises an upper frame portion having a plurality of guide grooves formed in opposing inner surface portions thereof for frictionally holding a plurality of terminal pins of an IC element, a lower frame portion formed integrally on the lower side of the upper frame portion which can be fitted to the periphery of an IC socket to which the IC element is attached, a lateral plate portion formed integrally with either the upper frame portion or the lower frame portion which comes into contact with the bottom surface of a package of the IC element to restrict the depth of fitting of the IC element, indicating means provided on the upper frame portion for indicating the direction of fitting of the IC element in relation to the upper frame portion, and restricting means for restricting the direction of fitting of the lower frame portion in relation to the IC socket.

Specifically, to facilitate insertion of the IC element, each guide groove has an inclined surface formed in an upper end portion thereof for guiding the corresponding terminal pin.

To protect the terminal pins of the IC element thus held, the lower frame portion has a height enough to accommodate the terminal pins.

To facilitate attaching and detaching of the IC element in relation to the IC socket, the upper frame portion has a flange portion formed on the periphery thereof to facilitate handling.

The restricting means is composed of a plurality of bridges provided asymmetrically in the IC socket and a plurality of protrusions provided perpendicularly on the bottom surface of the lateral plate portion which cooperate with the bridges.

The indicating means is a mark in the form of a protrusion or recess provided in the upper end surface of the upper frame portion, or a ridge formed on the inner surface of the upper frame portion which can fit in a groove portion of the end surface of the IC package.

DESCRIPTION OF THE PREFERRED EMBODIMENTS

Embodiments of the present invention will now be described with reference to the drawings.

Figure 1:
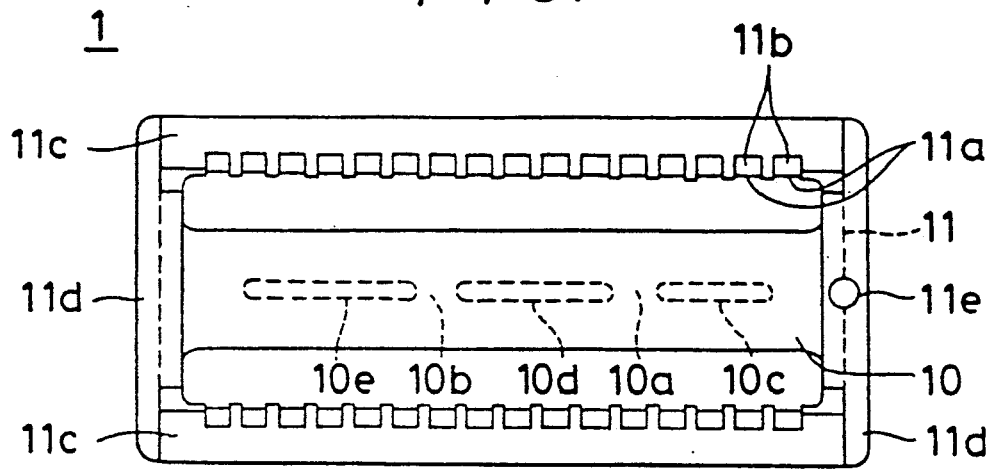
FIG. 1 is a plan view showing an embodiment of an IC holder according to the present invention.
Figure 2:
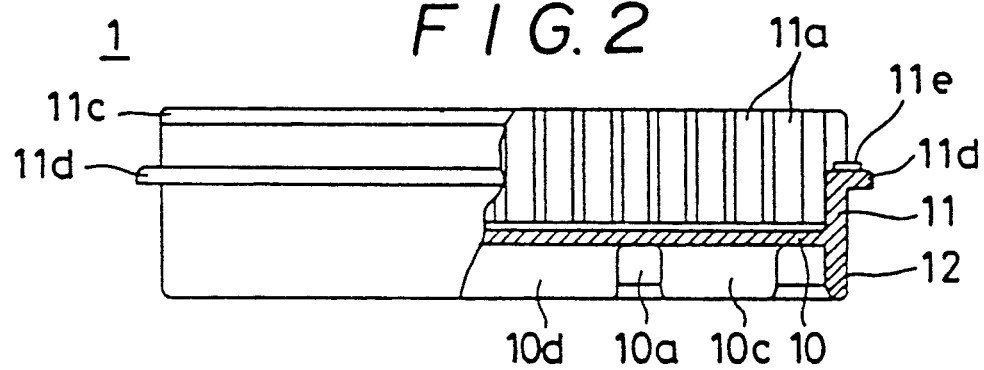
FIG. 2 is a front view, partly in cross section, of the embodiment.
Figure 3:
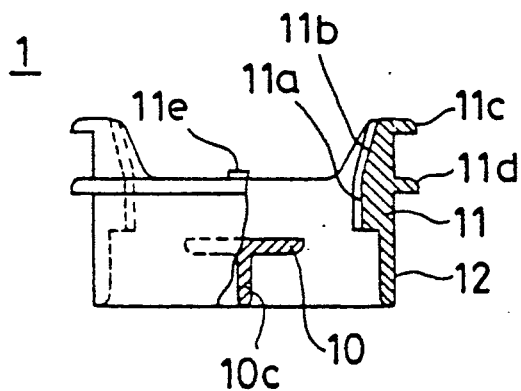
FIG. 3 is a right side view, partly in cross section, of the embodiment.

As shown in FIGS. 1 through 3, an IC holder 1 has an upper frame portion 11 formed in an upper section thereof in which an integrated circuit (IC) element 2 (see FIG. 7) can be fitted. The IC holder 1 has a lower frame portion 12 formed integrally on the lower side of the upper frame portion 11 which can be fitted to the periphery of an IC socket 3 (see FIGS. 4 through 6) for attachment of the IC element 2. The upper frame portion 11 has a plurality of guide grooves 11a formed in opposing inner surface portions thereof which can frictionally hold a plurality of terminal pins 21 of the IC element 2. Since each terminal pin 21 projects outward and is bent downward to have a biasing property, the terminal pins 21 are held in resilient contact with the corresponding guide groove 11a by its biasing force so that the IC element 2 can be held in the upper frame portion 11 nondetachably by the frictional force between them. Each guide groove 11a has an inclined surface 11b (see FIG. 3) formed in an upper end portion thereof to facilitate insertion of the corresponding terminal pin 21.

A lateral plate portion 10 is formed integrally with either the upper frame portion 11 of the lower frame portion 12. The upper surface of the lateral plate portion 10 faces the bottom surface of a package part 20 of the IC element and thus can restrict the depth of fitting of the IC element 2 into the IC holder 1. The height of the lower frame portion 12 is of such a size that when the IC element 2 is held in the upper frame portion 11 with its depth of fitting restricted by the lateral plate portion 10, each terminal pin 21 will not extend beyond the lower end surface of the lower frame portion 12.

The upper frame portion 11 has flange portions 11c and 11d formed on the periphery thereof to facilitate handling thereof. Further, the upper frame portion 11 has an indicator 11e in the form of a protrusion formed on the upper end surface thereof which acts as indicating means for indicating the direction of fitting of the IC element 2 in relation to the upper frame portion.

Figure 4:
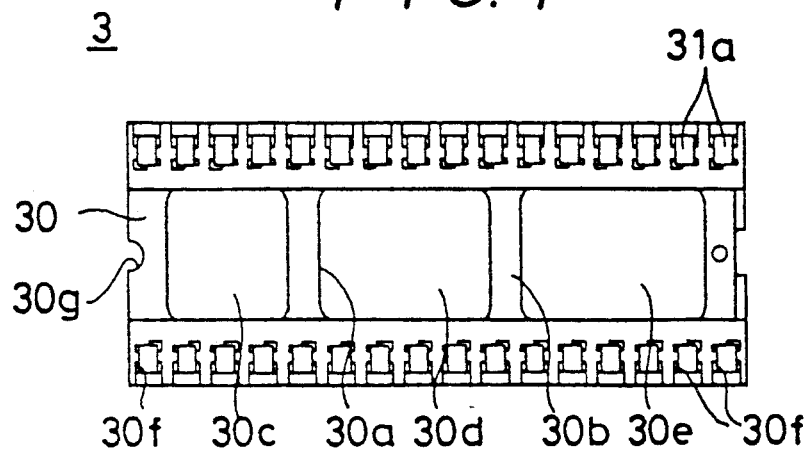
FIG. 4 is a plan view showing an exemplary IC socket.
Figure 5:
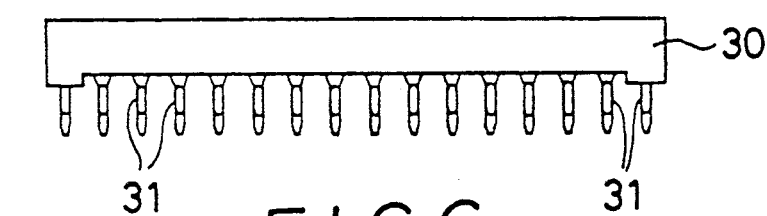
FIG. 5 is a front view of the IC socket.
Figure 6:
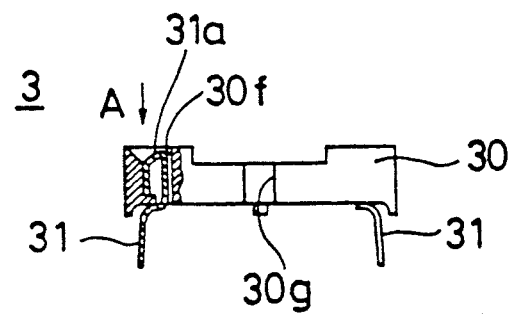
FIG. 6 is a left side view, partly in cross section, of the IC socket.
Figure 7:
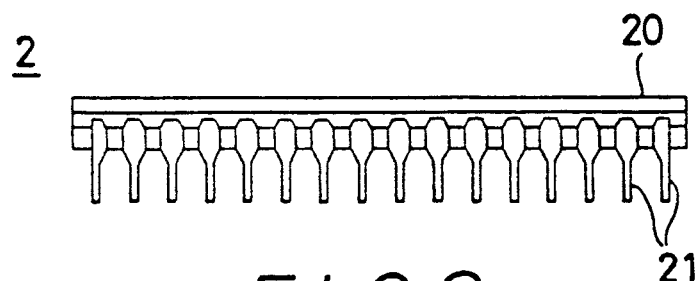
FIG. 7 is a front view of an exemplary IC element.

Regarding the combination of the lower frame portion 12 and the IC socket 3, there is provided a restricting means for restricting the direction of fitting of the lower frame portion 12 in relation to the IC socket 3. Specifically, as shown in FIGS. 4 through 6, a frame 30 of the IC socket 3 includes bridges 30a and 30b distributed asymmetrically, these bridges defining opening portions 30c, 30d and 30e in an asymmetric manner. In the IC holder 1, the lateral plate portion 10 has protrusions 10c, 10d and 10e projecting asymmetrically from the bottom surface thereof, these protrusions defining recesses 10a and 10b therebetween. Therefore, as long as the IC holder and the IC socket are in accord with each other in terms of the direction of fitting, the protrusions 10c, 10d and 10e can fit in the corresponding opening portions 30c, 30d and 30e, and the bridges 30a and 30b can fit in the corresponding recesses 10a and 10b.

The IC socket 3 has a plurality of terminal pins 31, and an upper end portion of each terminal pin is folded and bent to define a resilient portion 31a, which is pressure-fitted in a corresponding hole 30f formed in the frame 30. Each terminal pin 31 is received nondetachably, and its lower end portion projects downward from the frame 30. Each terminal pin 21 of the IC element 2 is pushed in between the corresponding resilient portion 31a and one wall of the corresponding hole 30f (in the direction of the arrow A as shown in FIG. 6) in opposition to the resilient force of the resilient portion 31a, so that each terminal pin 21 is held in electrical contact with the corresponding terminal pin 31. An upper end portion of each hole 30f as well as an upper portion of each resilient portion 31a has an inclined surface as shown in FIG. 6 to facilitate insertion of each terminal pin 21. The frame 30 has a groove portion 30g formed in an end surface portion thereof which acts as a mark indicative of the direction of connection with the IC element 2.

In the IC holder 1 of the foregoing structure according to the present invention, when assembling, the IC element 2 is aligned in the direction of fitting indicated by the indicating means 11e, and then gradually inserted in the upper frame portion 11. Consequently, each terminal pin 21 slides into the corresponding guide groove 11a while being guided by the corresponding inclined surface 11b. Finally, the IC element 2 is frictionally held by the spring force of each terminal pin 21 with its depth of fitting being restricted by the lateral plate portion 10. Any optional IC element completed in such a condition as above is supplied to a user, that is, the IC element is safely held in the IC holder 1 without any terminal pin 21 exposed.

Figure 8:
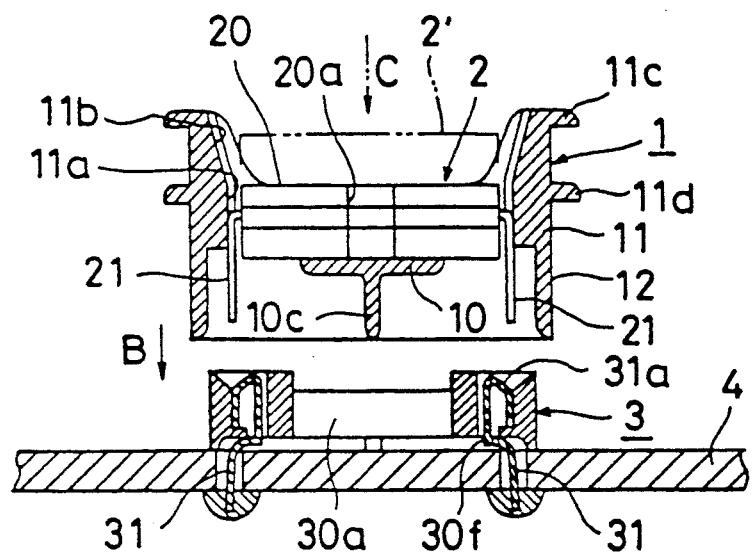
FIG. 8 is a schematic sectional view showing the connection between the IC element held by the IC holder and the IC socket.

When the user desires to replace the IC element with a different one, as shown in FIG. 8, the user detaches the IC element 2 from the IC socket 3 fixedly connected with a circuit board 4 of a computer device, holds the flange portions 11c and 11d of the IC holder 1 with an optional new IC element 2 held therein, and moves the IC holder down in the direction of the arrow B such that the lower frame portion 12 is fitted to the IC socket 3. Since the direction of fitting of the IC holder 1 in relation to the IC socket 3 is restricted by the cooperation of the bridges 30a and 30b with the protrusions 10c, 10d and 10e, the fitting direction is recognized as correct when the IC holder could be fitted to the IC socket. That is, when the direction of fitting is correct, a groove portion 20a of the IC element 2 and the groove portion 30g of the IC socket 3 are aligned on the same side. Upon fitting, the IC element 2 is pushed by the IC socket 3 to separate from the lateral plate portion 10 and rise up to the chain line position 2'. Then the user pushes the upper surface of the IC package 20 at the raised position downward in the direction of the arrow C until the IC package comes again into contact with the lateral plate portion 10. In the course of downward shifting, each terminal pin 21 comes into contact with the corresponding terminal pin 31 of the IC socket 3 while resiliently deforming the resilient portion 31a of the pin 31. In this way, the new IC element can be connected to the circuit of the device.

Although the indicating means 11e shown in FIG. 2 for indicating the direction of fitting of the IC element 2 in relation to the upper frame portion 11 is the mark in the form of a protrusion, the mark may be made in the form of a recess (not shown). The direction of fitting can be made reliable by bringing the mark in the form of, for example, the groove portion 20a (see FIG. 8) formed in the end surface portion of the package 20 of the IC element 2 in accord with the mark in the form of the protrusion or recess.

Further, the indicating means 11e may be made in the form of a vertical ridge (not shown) provided in an inner surface portion of the upper frame portion 11 which can be fitted in the groove portion 20a formed in the package.

Further, the restricting means may be modified depending on the shape of the IC socket. It is sufficient that the restricting means cooperate with the IC socket to restrict the direction of fitting. Further, the flange portion is not necessarily made in the form of two stages.

The IC holder of the foregoing structure according to the present invention can use general IC elements and IC sockets without modification. Thus costs can be reduced, and all IC elements can be supplied on the condition that each is held in each IC holder. While the possibility of damage of the IC element can be lessened.

The IC element can always be connected to the IC socket in the correct direction with the aid of the indicating means and the restricting means; thus, trouble such as erroneous insertion can never occur. The user can readily change the IC elements as needs demand.

The IC element can be readily inserted in the IC holder with the aid of the inclined surface of each guide groove, and each terminal pin never projects beyond the IC holder. Thus the IC element can be held without any damage to the terminal pins.

The flange portion is provided to facilitate handling such that the IC element held in the IC holder can be readily attached to and detached from the IC socket.

The IC holder is simple in structure and thus can be marketed at a low price.

What I claim is:

1. An IC holding device for an IC element to be detachably attached to an IC socket, comprising an IC holder for holding an IC element having two rows of terminal pins to be detachably attached to an IC socket, said IC element having an unassembled state in which the terminal pins in one row are spaced from the terminal pins in the other row a first distance, said IC holder having an upper frame portion having two spaced and opposed side walls joined to two spaced and opposed end walls, said side walls having upper edges and inner surfaces extending from said upper edges, tapered guide grooves on said inner surfaces extending from said upper edges, retaining grooves opening up onto said inner surfaces, said retaining grooves being aligned with and forming continuation of said guide grooves, said guide grooves being tapered to converge inwardly of the IC holder as said retaining grooves are approached, said guide grooves guiding said terminal pins of said IC element into said retaining grooves, said retaining grooves in the inner surface of one side wall being spaced from the retaining grooves in the inner surface of the other side wall a second distance which is less than said first distance such that said terminal pins are frictionally and resiliently retained in said retaining grooves after having been guided into said retaining grooves by said tapered guide grooves, said IC holder having a lower frame portion integral with said upper frame portion, said lower frame portion being fitted to the periphery of an IC socket to which the IC element is detachably attached, said IC holder having an integral lateral plate disposed to restrict the depth of insertion of said IC element into said IC holder, indicating means on said upper frame portion for indicating the correctly oriented direction of insertion of said IC element into said IC holder, and restricting means on said IC holder for restricting the fitting of said IC holder to said IC socket to a correctly oriented fitting such that said IC holder can only be fitted to said IC socket when said IC holder is correctly oriented relative to said IC socket.

2. An IC holding device according to claim 1, wherein said lower frame portion has an outer wall disposed about said terminal pins when said IC element is fully inserted into said IC holder, said outer wall having a lower terminating end which extends beyond the terminating ends of said terminal pins.

3. An IC holding device according to claim 1, wherein said upper frame portion has an outer periphery, and a flange section extending about said outer periphery to facilitate manual handling of said IC holder.

4. An IC holding device according to claim 1, wherein said restricting means comprises a plurality of transverse bridges asymmetrically disposed on said IC socket, and a plurality of asymmetrically disposed protrusions extending perpendicularly downwardly from said lateral plate and received between said bridges.

5. An IC holding device according to claim 1, wherein said IC holder has two spaced and opposed side walls joined to two spaced and opposed end walls, said lateral plate extending integrally from said end walls, said lateral plate having lateral edges spaced from said side walls, said terminal pins passing through said space between said lateral edges and said side walls.

6. An IC holding device according to claim 1, wherein said lateral plate has a bottom wall, said restriction means comprising protrusions extending perpendicularly downwardly from said bottom wall.

7. An IC holding device according to claim 5, wherein said two side walls have an upper edge, said two end walls having an upper edge, said upper edges of said two side walls being higher than said two upper edges of said end walls, further comprising first flanges extending outwardly from said two upper edges of said side walls and second flanges extending outwardly from said two upper edges of said end walls.

8. An IC holder device according to claim 7 further comprising third flanges extending outwardly from said two side walls, said third flanges being aligned with and forming continuations of said second flanges such that said second and third flanges extend about the periphery of said IC holder.

9. An IC holding device according to claim 1, wherein said IC socket comprises a plurality of passages which receive said IC element terminal pins, each of said passages having opposed side walls, a socket pin in each of said passages, said socket pin having a resilient bent portion disposed between said passage side walls, said IC holder terminal pins being resiliently held between said resilient bent portion and one of said passage side walls when the IC holding device is in its assembled state.

10. An IC holding device according to claim 9, wherein said one passage side wall has an end formed with a first tapered wall section, said resilient bent portion of said socket pin having a second tapered wall section, said first and second wall sections being disposed in a V-shaped configuration at the entrance of said passage to facilitate receiving said IC element terminal pins.

11. An IC holding device for an IC element to be detachably attached to an IC socket, comprising an IC holder for holding an IC element having two rows of terminal pins to be detachably attached to an IC socket, said IC element having an unassembled state in which the terminal pins in one row are spaced from the terminal pins in the other row a first distance, said IC holder having an upper frame portion having two spaced and opposed side walls joined to two spaced and opposed end walls, said side walls having upper edges and inner surfaces extending from said upper edges, tapered guide grooves on said inner surfaces extending from said upper edges, retaining grooves opening up onto said inner surfaces, said retaining grooves being aligned with and forming continuation of said guide grooves, said guide grooves being tapered to converge inwardly of the IC holder as said retaining grooves are approached, said guide grooves guiding said terminal pins of said IC element into said retaining grooves, said retaining grooves in the inner surface of one side wall being spaced from the retaining grooves in the inner surface of the other side wall a second distance which is less than said first distance such that said terminal pins are frictionally and resiliently retained in said retaining grooves after having been guided into said retaining grooves by said tapered guide grooves, said IC holder having a lower frame portion integral with said upper frame portion, said lower frame portion being fitted to the periphery of an IC socket to which the IC element is detachably attached, said IC holder having an integral central lateral plate extending integrally from said end walls and disposed to restrict the depth of insertion of said IC element into said IC holder, said central lateral plate having lateral edges equally spaced from each of said side walls, said terminal pins passing through said spaces between said lateral edges and said side walls, and restricting means on said IC holder for restricting the fitting of said IC holder to said IC socket to a correctly oriented fitting such that said IC holder can only be fitted to said IC socket when said IC holder is correctly oriented relative to said IC socket, said restricting means comprising a plurality of transverse bridges asymmetrically disposed on said IC socket, and a plurality of asymmetrically disposed protrusions extending perpendicularly downwardly from said central lateral plate and received between said bridges.

* * * * *